United States Patent [19]

Minezawa

[11] Patent Number: 4,947,123
[45] Date of Patent: Aug. 7, 1990

[54] BATTERY STATE MONITORING APPARATUS

[75] Inventor: Yukihiro Minezawa, Anjo, Japan

[73] Assignees: Aisin Aw Co., Ltd., Anjo; Kabushiki Kaisha Shinsangyokaihatsu, Tokyo, both of Japan

[21] Appl. No.: 274,569

[22] Filed: Nov. 23, 1988

[30] Foreign Application Priority Data

Nov. 30, 1987 [JP] Japan .............................. 62-302443

[51] Int. Cl.$^5$ ......................................... G01N 27/46
[52] U.S. Cl. .................................... 324/427; 320/48; 324/431; 340/636
[58] Field of Search ............... 324/426, 427, 428, 431, 324/430; 340/636; 320/48

[56] References Cited

U.S. PATENT DOCUMENTS 4,423,378 12/1983 Marino et al. ................... 324/431 X
4,595,880 6/1986 Patil ................................. 324/431 X
4,678,998 7/1987 Muramatsu ..................... 324/430 X
4,679,000 7/1987 Clark ............................... 324/426 X Primary Examiner—Reinhard J. Eisenzopf
Assistant Examiner—Robert W. Mueller
Attorney, Agent, or Firm—Varndell Legal Group

[57] ABSTRACT

A battery state monitoring apparatus determines the remaining life of a battery, which is used by being repeatedly charged and discharged, upon taking into account the charging/discharging characteristic of the battery and the surrounding temperature, thereby making it possible to ascertain the remaining life of the battery in accurate fashion. The apparatus includes a voltage measuring unit for measuring terminal voltage of a battery, a current measuring unit for measuring charging and discharging current of the battery, a temperature measuring unit for measuring temperature of the battery, an arithmetic unit to which measurement values outputted by the voltage measuring unit, current measuring unit and temperature measuring unit are applied for computing remaining life of the battery, and a remaining life display unit for displaying the remaining life of the battery computed by the arithmetic unit. Thus, the terminal voltage, charging and discharging current and the temperature of the battery are measured by the voltage measuring unit, current measuring unit and temperature measuring unit, and signals indicative of the measurement values are inputted to the arithmetic unit. Upon receiving these values, the arithmetic unit computes the remaining life of the battery and causes the results to be displayed on the display unit.

8 Claims, 11 Drawing Sheets

| Temp. °C | Coefficient |
|---|---|
| ⌇ 30 | $1 - \frac{1}{16}$ |
| ⌇ 20 | $1$ |
| ⌇ 10 | $1 + \frac{1}{16}$ |
| ⌇ 0 | $1 + \frac{1}{8}$ |
| ⌇ -10 | $1 + \frac{1}{4}$ |
| ⌇ | $1 + \frac{1}{2}$ |

| VOLTAGE PER BATTERY (V) | A/D-CONVERTED VALUE (Hex) | INITIAL VALUE OF REMAINING LIFE (Hex) | CAPACITY (%) |
|---|---|---|---|
| 12.72 | 7E | 36EF00 | 100 |
| 12.65 | 7D | 342F00 | |
| 12.58 | 7C | 317000 | 90 |
| 12.50 | 7B | 2EB100 | |
| 12.43 | 7A | 2BF200 | 80 |
| 12.36 | 79 | 293300 | |
| 12.29 | 78 | 267400 | 70 |
| 12.22 | 77 | 23B500 | |
| 12.14 | 76 | 20F600 | 60 |
| 12.07 | 75 | 1E3600 | |
| 12.00 | 74 | 1B7700 | 50 |
| 11.93 | 73 | 18B800 | |
| 11.86 | 72 | 15F900 | 40 |
| 11.78 | 71 | 133A00 | |
| 11.71 | 70 | 107B00 | 30 |
| 11.64 | 6F | DBC00 | |
| 11.57 | 6E | AFD00 | 20 |
| 11.50 | 6D | 83D00 | |
| 11.42 | 6C | 57E00 | 10 |
| 11.35 | 6B | 2BF00 | |
| 11.28 | 6A | 0 | 0 |

FIG. 13

| AMOUNT OF CURRENT | VALUE |
|---|---|
| 0 | 0 |
| 1 | 1 |
| 2 | 2 |
| 3 | 4 |
| 4 | 6 |
| | 7 |

FIG. 14

| AMOUNT OF CURRENT | VALUE |
|---|---|
| 0 | 0 |
| 1 | 1 |
| 2 | 2 |
| 3 | 3 |
| 4 | 5 |
| | 6 |

BATTERY STATE MONITORING APPARATUS

BACKGROUND OF THE INVENTION

This invention relates to a battery state monitoring apparatus for monitoring the remaining life of a battery of the type used by being repeatedly charged and discharged.

Batteries used while repeatedly undergoing charging and discharging find many applications and are essential in automotive vehicles. In a device or machine which employs such a battery, it is important to know the remaining life of the battery. The reason for this is that knowing the remaining life of the battery makes it possible to accurately determine when the battery should be replaced, the amount of use and when the changeover should be made between charging and discharging.

A specific example applying such art will now be described.

Figure 15:
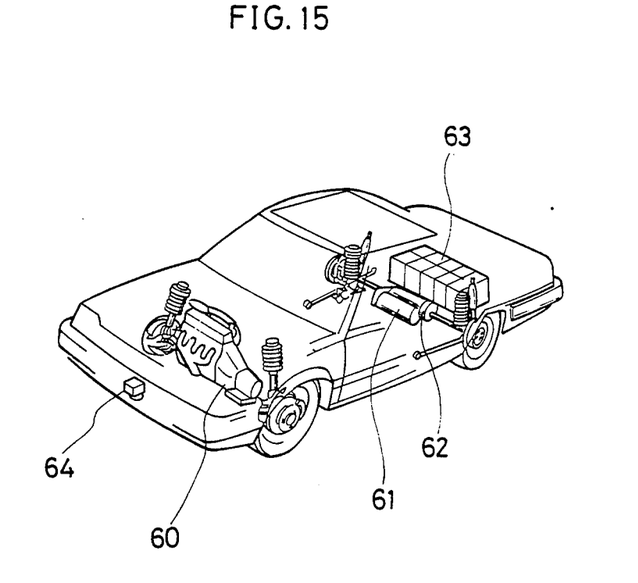
FIG. 15 is a perspective view showing an example of a hybrid automobile.

The applicant has previously filed applications relating to a vehicle equipped with a motor in which the front or rear set of wheels is driven by an engine and the other set is driven by a motor (see Japanese Patent Application Nos. 62-25735 and 62-37183). For example, in accordance with these previously filed applications, as shown in FIG. 15, an engine and a transmission 60 are mounted on the front-wheel side to drive the front wheels by the engine, and a motor 61, motor transmission 62 and battery 63 are mounted on the rear-wheel side to drive the rear wheels by the motor 61, with a road surface sensor 64 being mounted on the lower part of a front bumper. According to Japanese Patent Application No. 62-25735, driving force threshold values of the front and rear wheels are found by the road surface sensor 64, and driving force request values are apportioned to the engine and motor in dependence upon the remaining life of the battery 63 within a range in which the threshold values will not be exceeded. According to Japanese Patent Application No. 62-37183, such operating conditions as the accelerator opening, vehicle velocity and shift lever state are detected, the apportioned values of driving force of the engine and motor are set based on the operating conditions, and the apportioned values are revised in dependence upon the remaining life of the battery to control the engine and motor driving force.

Thus, monitoring the state of the battery is important. In the prior art, however, the state of the battery is monitored merely by measuring the terminal voltage of the battery or, in the case of a lead storage battery, by measuring the the specific weight of the electrolyte.

Figure 16:
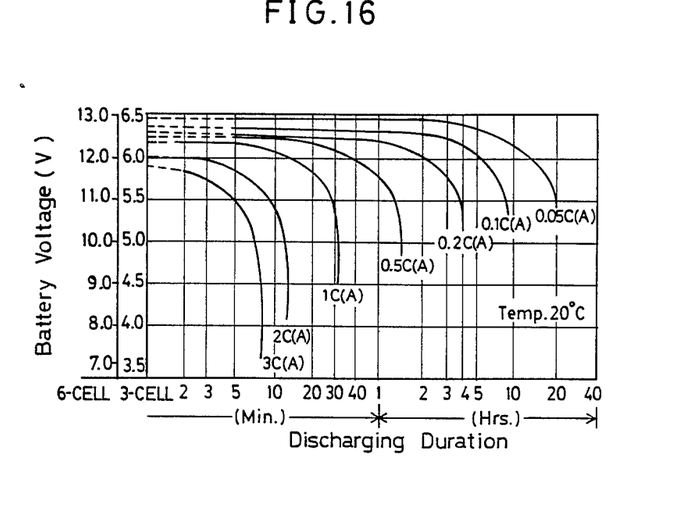
FIG. 16 is a graph of the discharge duration time of a battery vs. the battery voltage characteristic.
Figure 17:
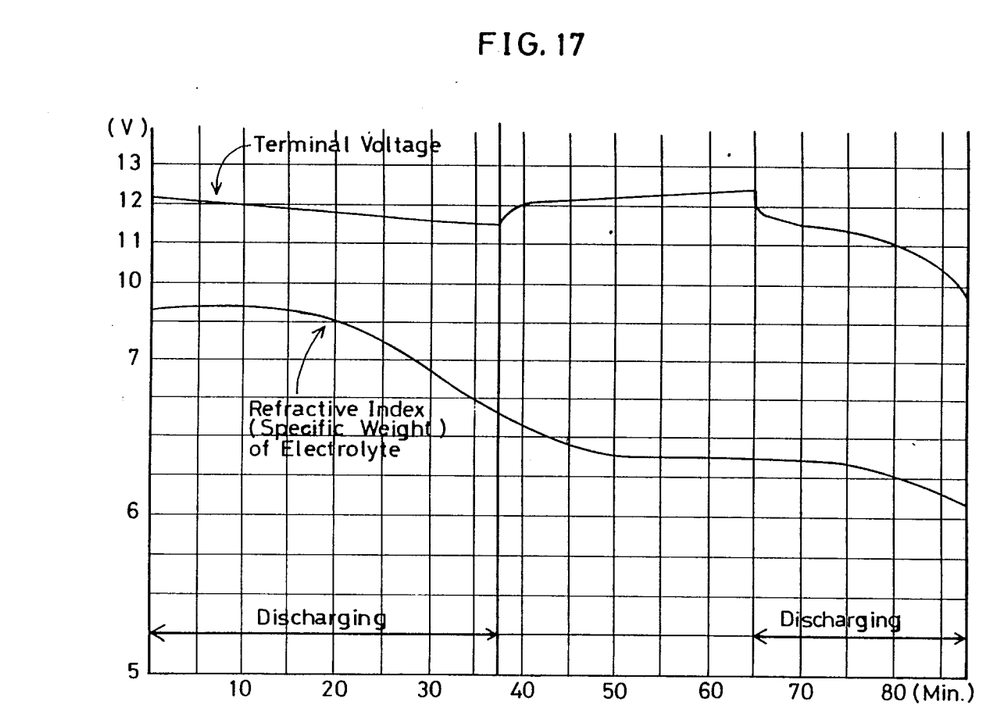
FIG. 17 is a graph showing the relationship among discharging time, terminal voltage and specific weight of electrolyte.

However, as will be understood from a plot of discharge duration time vs. battery voltage shown in FIG. 16, battery terminal voltage differs depending upon how much discharge current flows, even for the case of a single cell. Also, as shown in FIG. 17, there is a phenomenon in which, after discharge, terminal voltage fluctuates while the specific weight of electrolyte is stable. This means that the state of the battery cannot be accurately determined based solely on the terminal voltage.

Further, as shown in FIG. 17, a certain period of time is required for the specific weight of the electrolyte to stabilize. Consequently, the remaining life of the battery cannot be correctly determined in prompt fashion based solely on the specific weight of the electrolyte.

SUMMARY OF THE INVENTION

Accordingly, an object of the present invention is to provide a battery state monitoring apparatus capable of correctly determining the remaining life of a battery.

According to the present invention, the foregoing object is attained by providing a battery state monitoring apparatus comprising voltage measuring means for measuring terminal voltage of a battery, current measuring means for measuring charging and discharging current of the battery, temperature measuring means for measuring temperature of the battery, arithmetic means to which measurement values outputted by the voltage measuring means, current measuring means and temperature measuring means are applied for computing remaining life of the battery, and remaining life display means for displaying the remaining life of the battery computed by the arithmetic unit.

In accordance with the arrangement of the battery state monitoring apparatus described above, the terminal voltage, charging and discharging current and the temperature of the battery are measured by the voltage measuring means, current measuring means and temperature measuring means, and signals indicative of the measurement values are inputted to the arithmetic means. Upon receiving these values, the arithmetic means computes the remaining life of the battery and causes the results to be displayed on the display means. Thus, the remaining life of the battery is determined upon taking into account the charging and discharging characteristics of the battery and the temperature of the environment. This makes it possible to correctly ascertain the state of the battery.

Still other objects and advantages of the invention will in part be obvious and will in part be apparent from the specification.

The invention accordingly comprises the features of construction, combinations of elements and arrangement of parts which will be exemplified in the construction hereinafter set forth, and the scope of the invention will be indicated in the claims.

DESCRIPTION OF THE PREFERRED EMBODIMENT

An embodiment of the present invention will now be described with reference to the accompanying drawings.

Figure 1:
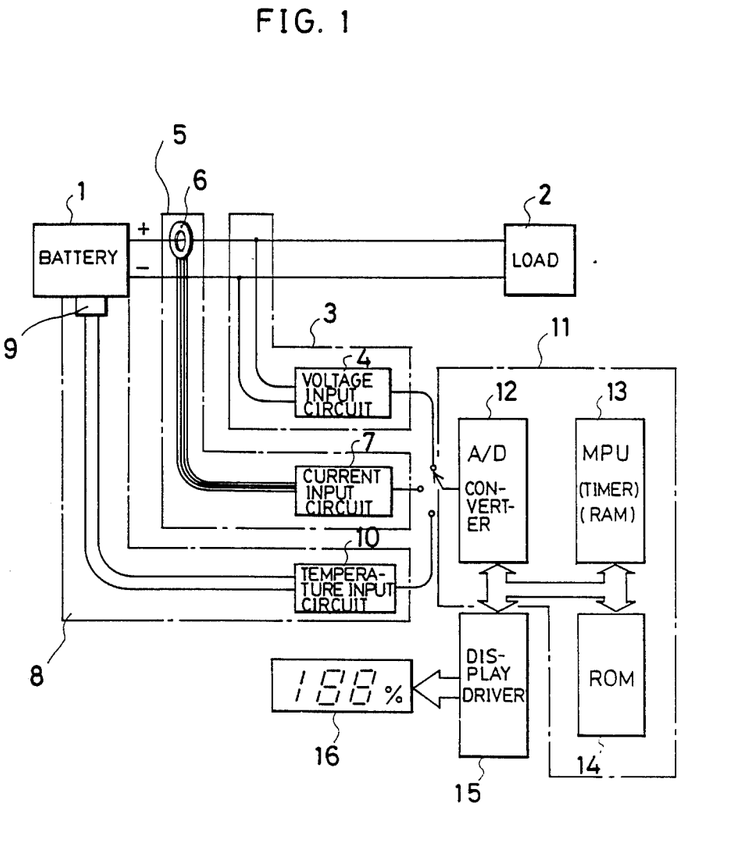
FIG. 1 is a block diagram illustrating the arrangement of an embodiment of a battery state monitoring apparatus according to the present invention.

With reference to FIG. 1, the battery state monitoring apparatus of the invention includes a voltage measurement unit 3 for measuring the terminal voltage of a battery 1. The terminal voltage is voltage-divided by a voltage input circuit 4 to a range suited to an A/D converter circuit 12 and is then inputted to the circuit 12. The apparatus further includes a current measurement unit 5 which measures the charging and discharging current of the battery 1 and applies the measurement value to the A/D converter circuit 12 via a current input circuit 7. Current measurement is performed by measuring the strength of a magnetic field, which is produced by the current that flows through the +line of the battery 1, by a current sensor 6 comprising a Hall device. The current input circuit 7 includes a constant-current circuit for supplying the Hall device with current, and an amplifier circuit for amplifying the output signal of the Hall device. Also provided in the apparatus is a temperature measurement unit 8 for applying a value indicative of temperature, which is measured by a temperature sensor 9 attached to the battery case, to the A/D converter circuit via a temperature input circuit 10. A thermister can be used as the temperature sensor 9. The apparatus further comprises an arithmetic unit 11 which computes the remaining life of the battery from the voltage value, current value and temperature value obtained as the result of the foregoing measurements, and which outputs the result of computation to a display driver 15. The display driver 15 drives a remaining life display unit 16, which displays the remaining life of the battery as a percentage. The display unit 16 may comprise a light-emitting diode, a liquid crystal cell or any other well-known display device.

Figure 2:
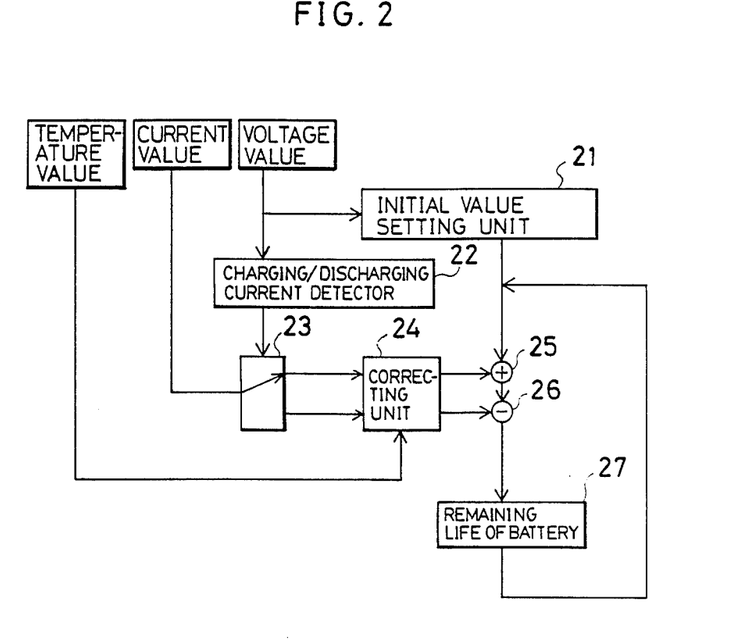
FIG. 2 is a block diagram illustrating the principle of a computation for determining the remaining life of a battery.
Figure 3:
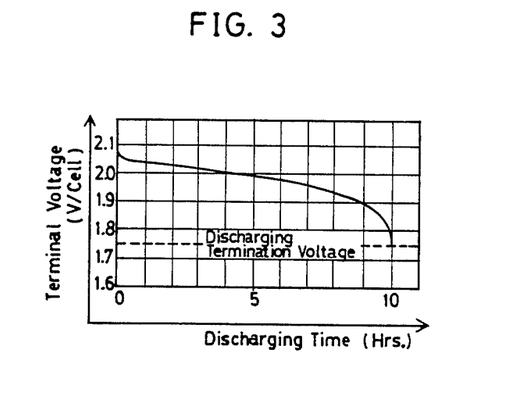
FIG. 3 is a graph illustrating a discharge characteristic of a battery.
Figure 4:
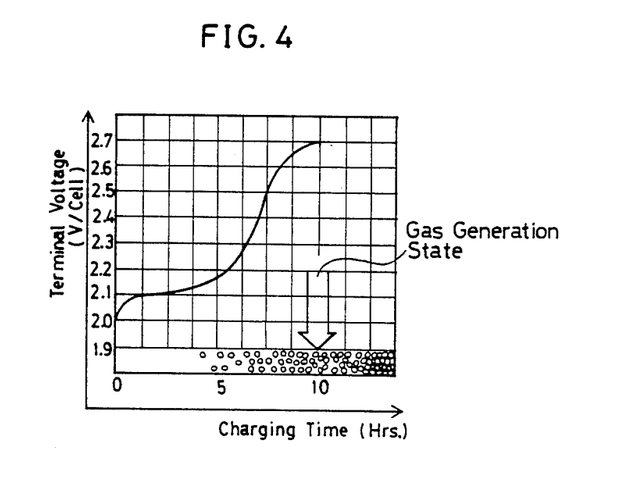
FIG. 4 is a graph illustrating a charge characteristic of a battery.

The principle on the basis of which the remaining life of a battery is determined from the measured values of voltage, current and temperature is shown in FIG. 2. First, an initial value of remaining life at the time of system start-up is set by a setting circuit 21 based on the voltage value. Next, a charging/discharging detector circuit 22 determines, at a predetermined time interval and based on the voltage value, whether the battery is in a charging or discharging state. If the battery is in the charging state, a value conforming to the current value is obtained by a changeover circuit 23 and correcting circuit 24 and this value is added to the remaining life of the battery by an adder circuit 25. If the battery is in the discharging state, a value conforming to the current value is obtained by the changeover circuit 23 and correcting circuit 24 and this value is subtracted from the remaining life of the battery by a subtractor circuit 26. The value added to or subtracted from the remaining life of the battery is corrected in accordance with temperature by the correcting circuit 24. The remaining life of the battery thus obtained, which is shown at numeral 27, is renewed by being repeatedly subjected to the above-described processing every 10 msec. As for the processing performed by the charging/discharging detector circuit 22, it will suffice to adopt an arrangement in which charging is determined to be in effect if the terminal voltage exceeds 2.1 V/cell, and discharging is determined to be in effect if the terminal voltage is less than 2.1 V/cell. Specifically, as will be understood from the discharge characteristic curve of FIG. 3, voltage at the start of discharge has a value slightly less than 2.1 V per cell, and as will be appreciated from the charging characteristic curve of FIG. 4, voltage at the start of charging has a value slightly greater than 2.0 V per cell. Therefore, by adopting 2.1 V/cell as a boundary value, it is appropriate to judge that charging is in effect when this value is exceeded and that discharging is in effect when terminal voltage falls below this value. It should be noted that the determination as to whether charging or discharging is in effect can also be made based on the direction of current flow.

Figure 5:
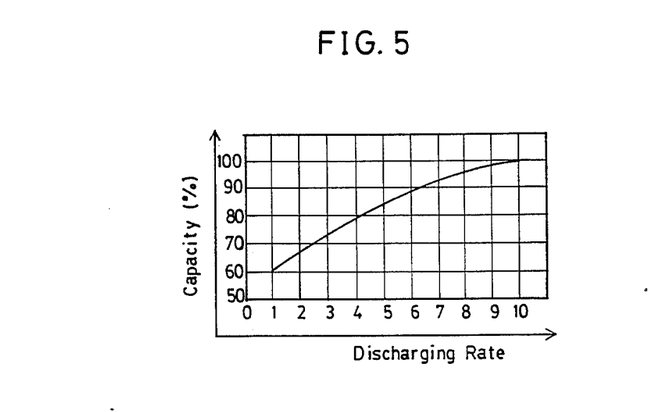
FIG. 5 is a graph illustrating the relationship between battery discharge rate and capacity.
Figure 6:
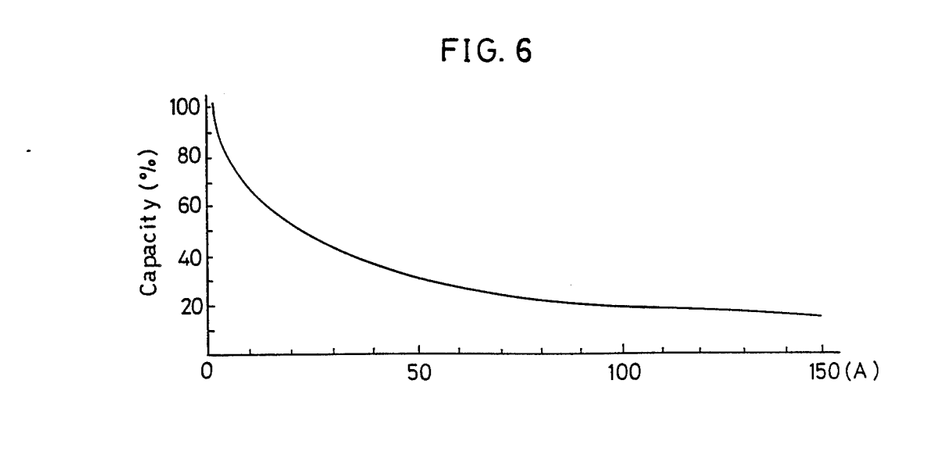
FIG. 6 is a graph illustrating the relationship between battery discharging current and capacity.
Figure 7:
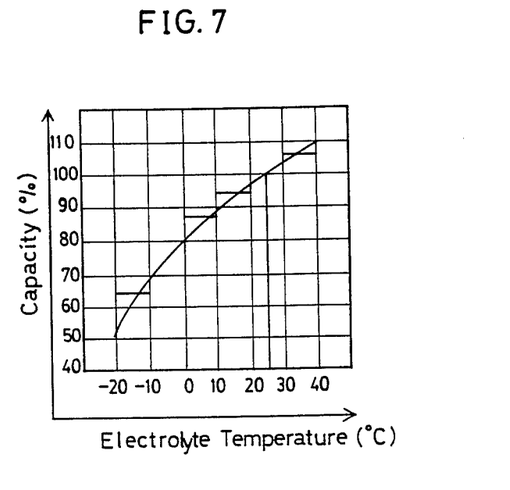
FIG. 7 is a graph illustrating the relationship between battery electrolyte temperature and capacity.
Figure 8:
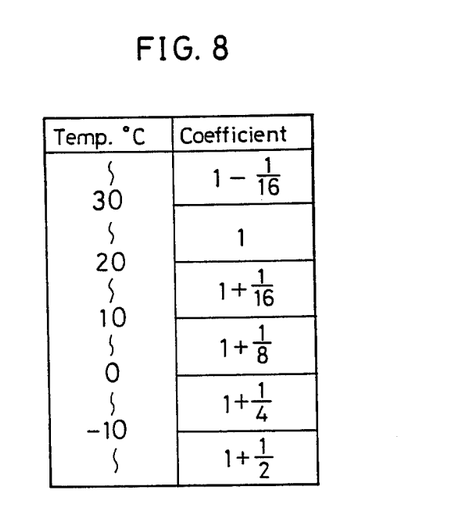
FIG. 8 is a view illustrating a temperature correction map.

With regard to the processing performed by the subtractor circuit 26, the value subtracted at the time of discharge is determined from FIG. 5, which shows the relationship between discharge rate and capacity, and from FIG. 6 illustrating the relationship between discharging current and capacity. As for the processing executed by the adder circuit 25, the value added at the time of charging should be 80% of the value substracted at discharge time. The temperature correction resulting from the processing executed by the correcting circuit 24 is performed in the following manner. As shown in FIG. 7, the relationship between temperature and capacity is expressed by a continuous curve. However, in order to simplify the arithmetic operations, temperature is divided into intervals of 10° C. for each of which a coefficient is set, as shown in FIG. 8. A temperature correction is performed by multiplying the value added to or subtracted from remaining life by the relevant coefficient.

The foregoing is the principle on the basis of which the remaining life of a battery is computed. The processing is executed in accordance with a program stored in a ROM 14 of the arithmetic unit 11. The processor also includes an MPU 13 having a RAM for storing measurement values A/D-converted by the A/D converter 12.

Figure 10:
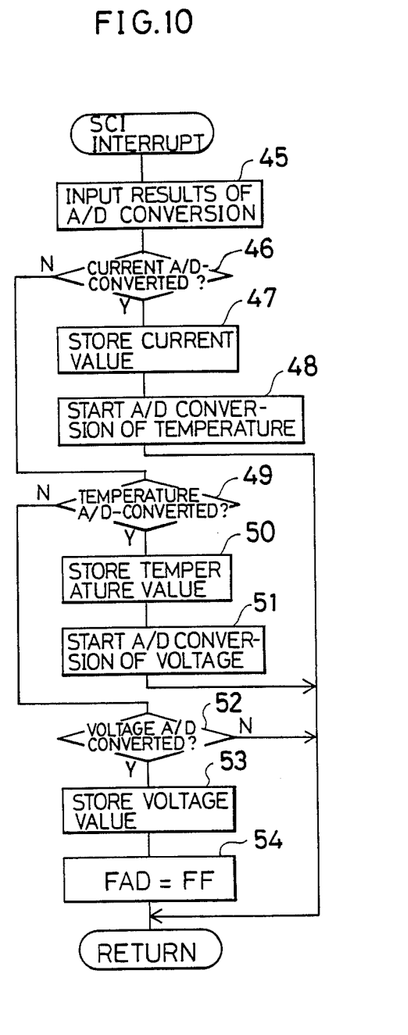
FIG. 10 is a flowchart of SCI interrupt processing.
Figure 11:
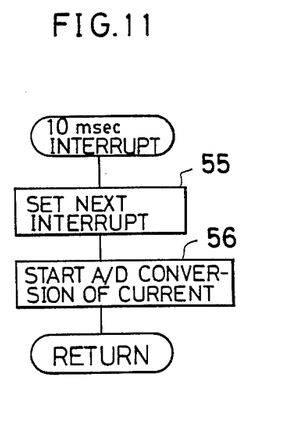
FIG. 11 is a flowchart of 10 msec interrupt processing.

The flow of processing executed by the MPU 13 will now be described in detail with reference to FIGS. 9, 10 and 11.

Figure 9:
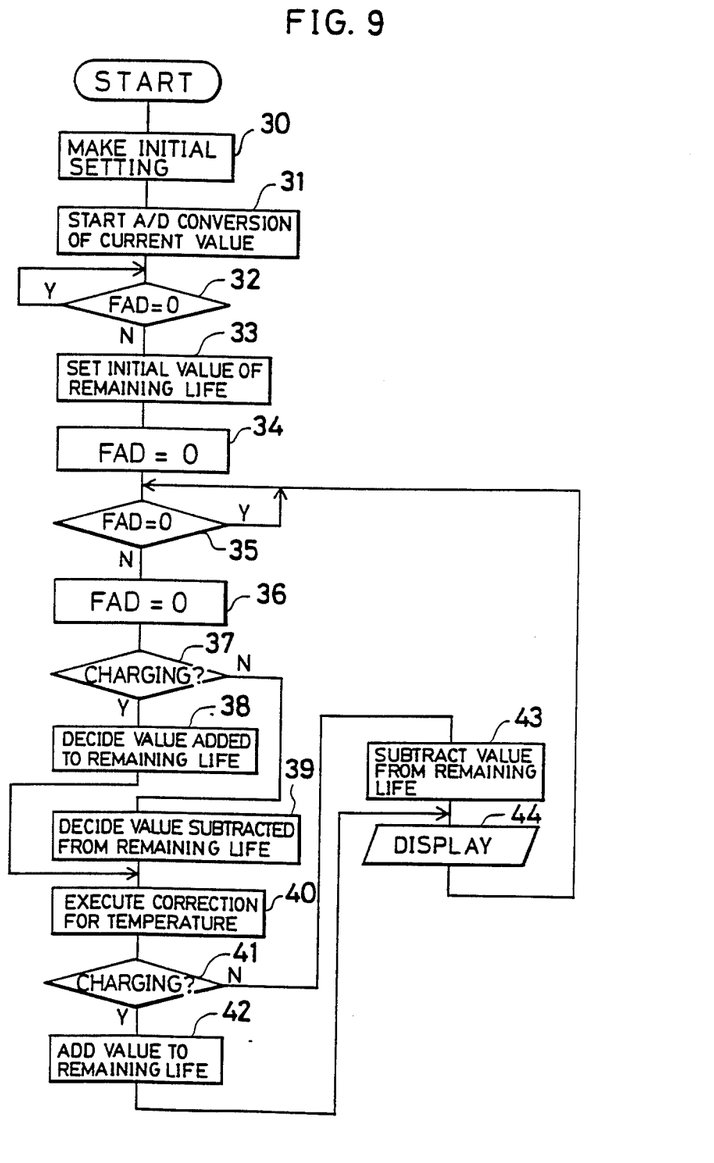
FIG. 9 is a flowchart of processing for displaying the remaining life of a battery.

First, with reference to FIG. 9, the system is initially set at a step 30, after which A/D conversion of the current value is started at a step 31. In response, SCI interrupt processing shown in FIG. 10 starts, with the result of the A/D conversion being inputted at a step 45. This is followed by a step 46, at which it is determined whether the inputted value is a current value. This determination is made based upon whether the switch provided on the input side of the A/D converter circuit 12 is connected to the current input circuit 7. If the input is a current value, the current value is stored at a step 47 and the program proceeds to a step 48, at which A/D conversion of a temperature value is started. When it is determined at the step 46 that the input is not a current value, the program proceeds to a step 49, at which it is determined whether the input is a temperature value. If the input is a temperature value, then this value is stored at a step 50 and A/D conversion of a voltage value is started at a step 51. If the input is not a temperature value, on the other hand, it is determined at a step 52 whether the input is a voltage value. If the input is found to be a voltage value at this step, the voltage value is stored at a step 53 and a flag FAD is set to FF at a step 54, after which interrupt processing is terminated. The flag FAD indicates whether the voltage value has been stored. If the voltage value has been stored, FAD =FF will hold; if not, FAD=0 will hold.

When the current value is thus A/D-converted at the step 31, it is determined at a step 32 whether the flag FAD is 0, namely whether the voltage value has been stored. If the voltage value has not been stored, the system waits until it is stored. When the condition FAD=FF is established at the step 54 of the SCI interrupt processing shown in FIG. 10, the program proceeds to a step 33, which calls for setting of an initial value of remaining battery life based on the voltage value stored at the step 53 of FIG. 10. The setting of this initial value is performed while reference is made to a map, which is stored in the ROM 14 of FIG. 1, illustrating the relationship between battery terminal voltage and the initial value of remaining life. This map is as shown in FIG. 12.

Figure 12:
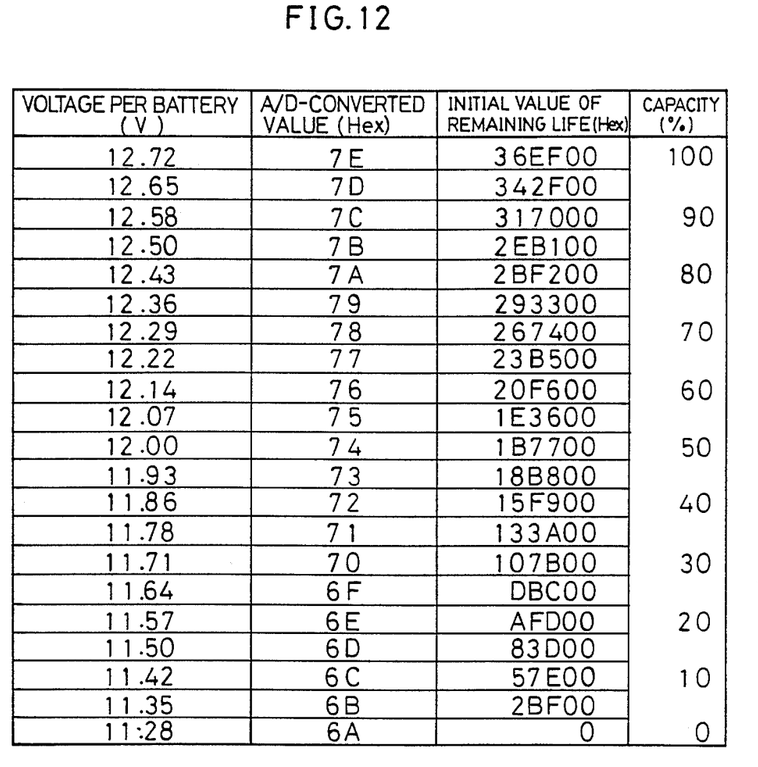
FIG. 12 is a view illustrating a map for setting an initial value of remaining life.

When an A/D converted terminal voltage value, e.g., "7C" is inputted to the ROM 14, "317000" is delivered by the ROM 14 as an output, as shown in FIG. 12. This serves as the initial value of remaining battery life. It will be appreciated that "317000" indicates a capacity of 90% from the "CAPACITY" column of FIG. 12.

When the initial value of remaining life is thus set at the step 33, the condition FAD=0 is established at a step 34. The reason for this is that if the condition FAD =FF were to continue, the voltage value utilized to set the initial value of remaining life would be employed as is in subsequent processing, namely in a determination as to whether the battery is in the charging state or discharging state. Thus, the step 34 is for the purpose of avoiding this problem. In other words, this step means that the voltage value used in order to set the initial value of remaining life is cleared from the location at which it is stored. Next, it is again determined at a step 35 whether the voltage value has been stored. If it has not been stored, the system waits until the condition FAD=FF is established at the step 54 of the SCI interrupt processing of FIG. 10. The program proceeds to a step 36 when FAD =FF is established. Since a voltage value is required in order to determine whether the battery is in the charging or discharging state, the step 36 is for the purpose of determining whether the latest voltage value has been stored. Though the latest stored voltage value is used at a step 37 to determine whether the charging state prevails, the condition FAD=0 is first established at the preceding step 36. The step 36 is provided for the same reason as the step 34 mentioned above.

Figure 13:
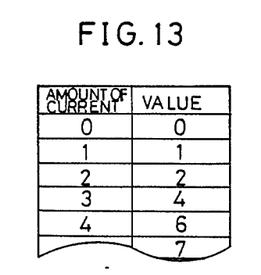
FIG. 13 is a view illustrating a map of values added to remaining life at the time of charging.
Figure 14:
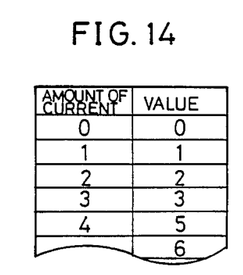
FIG. 14 is a view illustrating a map of values subtracted from remaining life at the time of discharging.

When it is determined at the step 37, based on the stored voltage value, that the battery is in the charging state, the value to be added to the remaining life of the battery is decided at a step 38. When it is determined at the step 37 that the battery is in the discharging state, the value to be subtracted from the remaining life of the battery is decided at a step 39. These values are decided, in the manner described above, from the curves shown in FIGS. 5 and 6, and are stored in the ROM 14 of FIG. 1 in the form of the respective maps shown in FIG. 13 and 14. The value decided at the step 38 or 39 is corrected for temperature at a step 40. The temperature correction is performed by obtaining a coefficient from the map of FIG. 8 based on the temperature value that has been stored at the step 50 or FIG. 10, and multiplying the value decided at the step 38 or 39 by this coefficient. It goes without saying that the map of FIG. 8 is also stored in the ROM 14. The value corrected for temperature at the step 40 is added to the remaining battery life at a step 42 if the charging state prevails and is subtracted from the remaining battery life at a step 43 if the discharging state prevails. The resulting value of remaining battery life is displayed at a step 44. This is performed by the display driver 15 and display unit 16 of FIG. 1. When the step 44 ends, the program returns to the processing of step 35. This is to revise the remaining battery life periodically every 10 msec, as described earlier in connection with FIG. 2. This processing is executed by the 10 msec interrupt processing of FIG. 11. Specifically, an interrupt is set at a step 55, and A/D conversion of the current value starts at a step 56. When this has been accomplished, the SCI interrupt processing of FIG. 10 starts and the above-described operation is carried out. When the condition FAC=FF is established at the step 54 in FIG. 10, the above-described operation is repeated from step 35 of FIG. 9, a new remaining life value is displayed and the program then proceeds to the next cycle of operation.

Though an embodiment of the invention has been described above, the invention is not limited to this embodiment and can be modified in various ways. For example, the current sensor and temperature sensor are not limited to a Hall device and thermister, respectively. Furthermore, though it may appear that only one of each of the maps is provided, plural items of data can be furnished for each map and the data conforming to the battery used can be designated as by keying in an input. Also, a change in a battery characteristic due to battery aging can be provided as a map to enable remaining battery life to be corrected for aging. Though the remaining life of the battery is updated every 10 msec in the illustrated embodiment, updating can be carried out at a suitable time interval providing that the time interval is not too long.

Thus, as will obvious from the foregoing description, the present invention is such that the remaining life of a battery is obtained from battery terminal voltage, charging/discharging current and battery temperature. As a result, a battery can be used upon accurately ascertaining its state, thus making it possible to avoid situations in which battery life runs out unexpectedly.

The present invention is very useful for devices and apparatus which employ batteries. In particular, the invention makes it possible to use both an engine and a motor very effectively in a case where the invention is applied to a hybrid vehicle capable of being driven by an engine and a motor, as described above with reference to FIG. 15.

What we claim is:
1. A battery state monitoring apparatus comprising:
voltage measuring means for measuring terminal voltage of a battery;
current measuring means for measuring charging and discharging current of said battery;
temperature measuring means for measuring temperature of said battery;
arithmetic means for receiving measurement values outputted by said voltage measuring means, said current measuring means and said temperature measuring means and for computing remaining battery life; said arithmetic means for performing a temperature correction including adder circuit means for increasing said computed remaining battery life based on said temperature correction when said battery is in a charging state; and remaining life display means for displaying said computed remaining battery life computed by said arithmetic means.

2. The battery state monitoring apparatus of claim 1, wherein said arithmetic means includes charging discharging detector means for detecting charging and discharging states of said battery, and subtracting means for decreasing said computed remaining battery life based upon said temperature correction when said battery is in a discharging state.

3. The battery state monitoring apparatus of claim 2, wherein said arithmetic means includes changeover circuit means for changing between said adder circuit means and said subtracting circuit means in accordance with an output of said charging discharging detector means.

4. The battery state monitoring apparatus of claim 2, wherein said arithmetic means includes memory means having a data map containing initial values of remaining battery life.

5. The battery state monitoring apparatus of claim 2, wherein said arithmetic means includes memory means having a data map containing additive values and said adder circuit means increases said computing remaining battery life based on said additive values.

6. The battery state monitoring apparatus of claim 2, wherein said arithmetic means includes memory means having a data map containing subtractive values and said subtracting circuit means decreases said computed remaining battery life based on said subtractive values.

7. The battery state monitoring apparatus of claim 1, wherein said display is a digital display.

8. A battery state monitoring apparatus comprising:

voltage measuring means for measuring terminal voltage of a battery;

current measuring means for measuring charging and discharging current of said battery;

temperature measuring means for measuring temperature of said battery;

arithmetic means for receiving measurement values outputted by said voltage measuring means, said current measuring means and said temperature measuring means and for computing remaining battery life; said arithmetic means including adder circuit means for increasing said computed battery life when said battery is in a charging state, memory means having a data map containing temperature correcting values, and correcting unit means for correcting an amount of said increasing of said computed remaining battery life based on said temperature correcting values.

* * * * *